(12) United States Patent
Hwang et al.

(10) Patent No.: US 8,415,200 B2
(45) Date of Patent: Apr. 9, 2013

(54) METHOD FOR MANUFACTURING SEMICONDUCTOR PACKAGE

(75) Inventors: Mi Sun Hwang, Gyunggi-do (KR); Keung Jin Sohn, Gyunggi-do (KR); Eung Suek Lee, Seoul (KR); Myung Sam Kang, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 0 days.

(21) Appl. No.: 13/007,444

(22) Filed: Jan. 14, 2011

(65) Prior Publication Data

US 2012/0088334 A1    Apr. 12, 2012

(30) Foreign Application Priority Data

Oct. 11, 2010    (KR) .................. 10-2010-0098850

(51) Int. Cl.
  *H01L 23/48*    (2006.01)
(52) U.S. Cl. .................. 438/107; 257/E23.011
(58) Field of Classification Search .................. 216/13; 257/E23.011; 438/121, 124
  See application file for complete search history.

(56) References Cited

U.S. PATENT DOCUMENTS

2009/0115047 A1*    5/2009    Haba et al. .................. 257/690

FOREIGN PATENT DOCUMENTS

| JP | 2002-222894 | 8/2002 |
| JP | 2003-309214 | 10/2003 |
| JP | 2004-063742 | 2/2004 |
| JP | 2005-183590 | 7/2005 |
| KR | 1020040086783 A | 10/2004 |
| KR | 1020100052835 A | 5/2010 |

OTHER PUBLICATIONS

Office Action from counterpart Korean Patent Application No. 10-2010-0098550, Feb. 14, 2012, 8 pages.
Office Action from counterpart Japanese Patent Application No. 2010-278422, mailed Oct. 2, 2012, 7 pages, English Summary included.

* cited by examiner

*Primary Examiner* — Julio J Maldonado
*Assistant Examiner* — Daniel Shook
(74) *Attorney, Agent, or Firm* — Blakely Sokoloff Taylor & Zafman LLP

(57) ABSTRACT

Disclosed herein is a method for manufacturing a semiconductor package which uses a base member 120 in which a first metal layer 113, a barrier layer 115, and a second metal layer 117 are stacked on both surface thereof in sequence based on an adhesive member 111 to simultaneously manufacture two printed circuit boards through a single sheet process, thereby making it possible to improve manufacturing efficiency; electrically connects a semiconductor chip 300 to a printed circuit board through a solder bump 250, thereby making it possible to implement a high-density package substrate; and forms a metal post 140 instead of a through hole to required in an interlayer circuit connection, thereby making it possible to reduce costs required in the processing/plating of the through hole.

17 Claims, 11 Drawing Sheets

METHOD FOR MANUFACTURING SEMICONDUCTOR PACKAGE

CROSS REFERENCE TO RELATED APPLICATION

This application claims the benefit of Korean Patent Application No. 10-2010-0098850, filed on Oct. 11, 2010, entitled "Method For Manufacturing Semiconductor Package" which is hereby incorporated by reference in its entirety into this application.

BACKGROUND OF THE INVENTION

1. Technical Field

The present invention relates to a method for manufacturing a semiconductor package.

2. Description of the Related Art

Recently, the electronic industry has developed slim, thin and light products having multi-function and high performance at low costs. One of the technologies accomplishing such trends is a packaging technology. With the development in the electronic industry, the usage of a package of electronic equipment mounted with a semiconductor chip has been abruptly increased and research into a package technology related thereto has been actively conducted.

At this time, most of the semiconductor packages have been accomplished such that one package is made by connecting a semiconductor chip to a printed circuit board by a wire bonding. This board is called a board on chip (BOC). In such a BOC structure, the semiconductor package may be designed only with a printed circuit board that includes only a single metal layer, and as a result, is in a superior position in terms of price competitiveness of a semiconductor package.

FIGS. 1 to 6 are cross-sectional views showing a method for manufacturing a semiconductor package according to the prior art in a process sequence.

As shown in FIG. 1, a copper clad laminate configured of an insulating layer 1 and a copper layer 2 is provided and a through hole 3 is machined on the copper clad laminate for interlayer conduction. The through hole is generally formed using CNC drilling or laser drilling.

Thereafter, as shown in FIG. 2, a chemical copper plating process and an electrical copper plating process are performed, thereby forming a copper plating layer 4 over the copper clad laminate.

Then, as shown in FIG. 3, the inside of the through hole 3 is filled with a plugging ink 5 and a plating is performed on the panel, thereby forming a plating layer 6 that is to be thick.

Then, as shown in FIG. 4, the plating layer 6 is selectively etched, thereby forming a circuit pattern 7.

Then, as shown in FIG. 5, a solder resist 8 is applied to both surfaces of the copper clad laminate formed with the circuit pattern 7 and an opening part is formed so that a portion of the circuit pattern 7 is opened.

Then, as shown in FIG. 6, after a slot 9 into which a wire 30 is to be inserted is machined, a solder ball 10 is formed on a pad part of the circuit pattern 7 and a semiconductor chip 20 is mounted on the substrate using the wire 30, thereby implementing a semiconductor package 50.

In order to implement the semiconductor package according to the prior art, the through hole should be formed on the copper clad laminate for interlayer conduction and the electrical/chemical copper plating processes should also be performed, which causes increase in manufacturing costs.

In addition, when a semiconductor chip is connected to a printed circuit board using a wire to implement a high-volume/high-density semiconductor package, there is a limit in receiving density of semiconductor chips and an increase in the manufacturing costs of a printed circuit board due to a demand for a BOC of two-layer or more.

SUMMARY OF THE INVENTION

The present invention has been made in an effort to provide a method for manufacturing a semiconductor package capable of being implemented in a high-density package at low manufacturing costs.

According to a first preferred embodiment of the present invention, there is provided a method for manufacturing a semiconductor package, including: (A) preparing a metal member in which a first metal layer, a barrier layer, and a second metal layer are stacked in sequence; (B) forming a metal post by selectively etching the second metal layer; (C) removing the exposed bather layer from the metal post and laminating an insulating layer on the first metal layer through which the metal post is penetrated; and (D) patterning the first metal layer contacting one surface of the insulating layer to form a circuit layer.

Herein, the first metal layer and the second metal layer may be made of copper, and the bather layer may be made of nickel.

The second metal layer may have a thickness in the range of 50 to 300 µm.

Step (B) may include: (B1) applying an etching resist to a surface of the second metal layer; and (B2) after patterning the etching resist, selectively etching the second metal layer before the bather layer to form the metal post.

The metal post at step (B) may have a diameter increased in a direction towards the bather layer.

The method for manufacturing a semiconductor package may further include, after step (C), (C') polishing an exposed surface of the insulating layer to form a roughness.

Step (D) may include: (D1) applying an etching resist to a surface of the first metal layer; and (D2) after patterning the etching resist, selectively etching the first metal layer to form a circuit layer.

The method for manufacturing a semiconductor package may further include, after step (D), (E) after applying a solder resist to both surfaces of the insulating layer, forming a first opening by processing the solder resist so that a pad part of the circuit layer formed on one surface of the insulating layer is exposed and forming a second opening by processing the solder resist so that the metal post formed on the other surface of the insulating layer is exposed.

The method for manufacturing a semiconductor package may further include, after step (E), (F) mounting a semiconductor chip on the pad part exposed by the first opening through a solder bump and forming a solder ball on the metal post exposed by the second opening.

According to a second preferred embodiment of the present invention, there is provided a method for manufacturing a semiconductor package, including: (A) preparing a base member in which a first metal layer, a barrier layer, and a second metal layer are stacked on both surfaces thereof in sequence based on an adhesive member; (B) forming a metal post by selectively etching the second metal layer; (C) removing the exposed bather layer from the metal post, laminating an insulating layer on the first metal layer through which the metal post is penetrated, and then, separating the first metal layer from the adhesive member; and (D) patterning the first metal layer contacting one surface of the insulating layer to form a circuit layer.

Herein, the first metal layer and the second metal layer may be made of copper, and the bather layer may be made of nickel.

The second metal layer may have a thickness in the range of 50 to 300 μm.

Step (B) may include: (B1) applying an etching resist to a surface of the second metal layer; and (B2) after patterning the etching resist, selectively etching the second metal layer before the bather layer to form the metal post.

The metal post at step (B) may have a diameter increased in a direction towards the bather layer.

The method for manufacturing a semiconductor package may further include, after step (C), (C') polishing an exposed surface of the insulating layer to form a roughness.

Step (D) may include: (D1) applying an etching resist to a surface of the first metal layer; and (D2) after patterning the etching resist, selectively etching the first metal layer to form a circuit layer.

The method for manufacturing a semiconductor package may further include, after step (D), (E) after applying a solder resist to both surfaces of the insulating layer, forming a first opening by processing the solder resist so that a pad part of the circuit layer formed on one surface of the insulating layer is exposed and forming a second opening by processing the solder resist so that the metal post formed on the other surface of the insulating layer is exposed.

The method for manufacturing a semiconductor package may further include, after step (E), (F) mounting a semiconductor chip on the pad part exposed by the first opening through a solder bump and forming a solder ball on the metal post exposed by the second opening.

DESCRIPTION OF THE PREFERRED EMBODIMENTS

Figure 1:
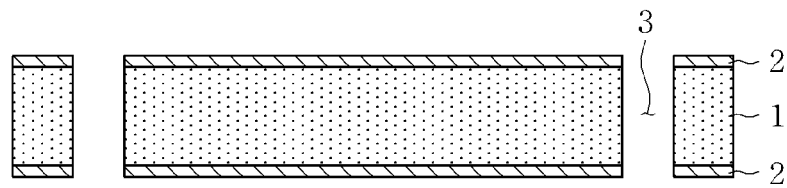
FIGS. 1 to 6 are cross-sectional views showing a method for manufacturing a semiconductor package according to the prior art in a process sequence.
Figure 2:
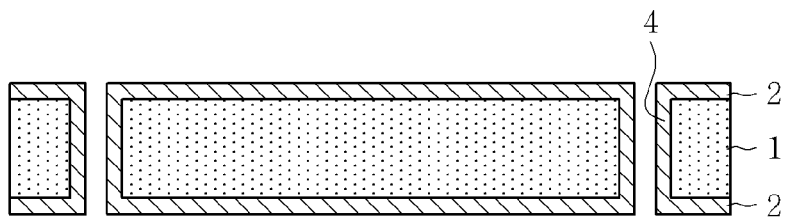
Figure 3:
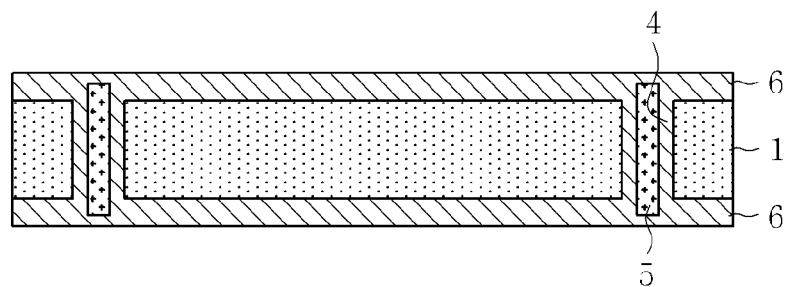
Figure 4:
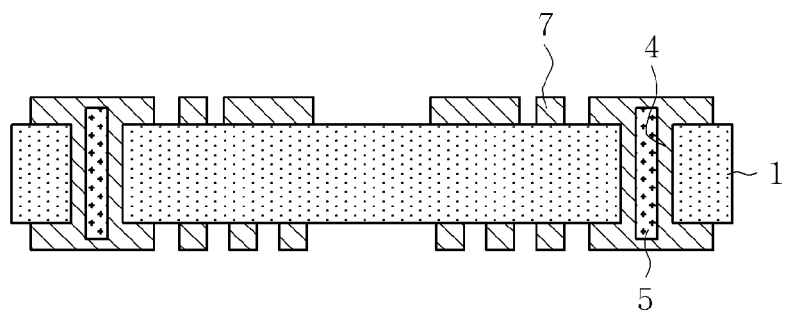
Figure 5:
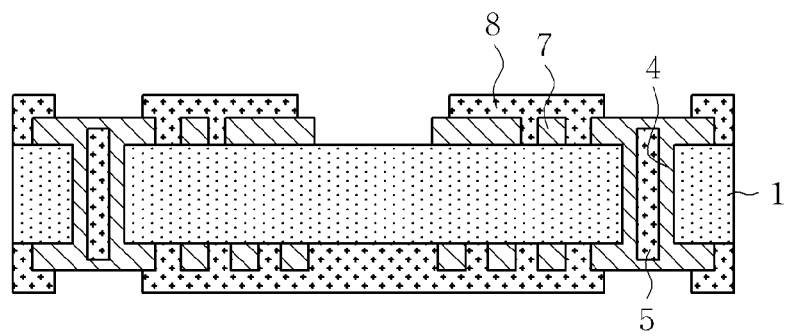
Figure 6:
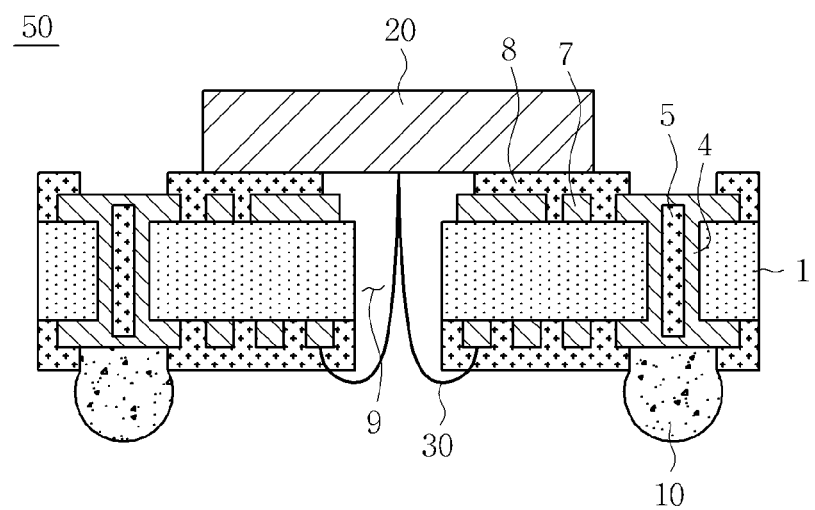

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

FIGS. 7 to 16 are cross-sectional views showing a method for manufacturing a semiconductor package according to a first preferred embodiment of the present invention in a process sequence. Hereinafter, a method for manufacturing a semiconductor package according to the present embodiment will be described with reference to the accompanying drawings.

Figure 7:
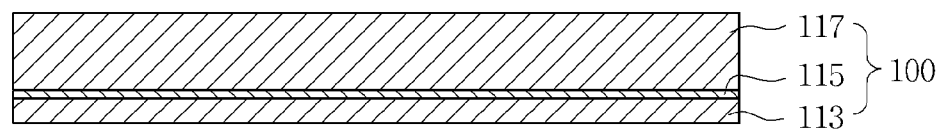
FIGS. 7 to 16 are cross-sectional views showing a method for manufacturing a semiconductor package according to a first preferred embodiment of the present invention in a process sequence.

First, as shown in FIG. 7, a metal member 100 is provided, the metal member 100 in which a first metal layer 113, a bather layer 115, and a second metal layer 117 are stacked in sequence.

Herein, the first metal layer 113 and the second metal layer 117 are made of copper (Cu). In a process described below, the first metal layer 113 is patterned to be formed as a circuit layer 160 and the second metal layer 117 is selectively etched to be formed as a metal post 140. In addition, the second metal layer 117 may be selected to have a thickness in the range of 50 to 300 μm, and the first metal layer 113 may have a thickness thinner than that of the second metal layer 117.

In addition, the bather layer 115 is interposed between the first metal layer 113 and the second metal layer 117 and has no limit in configuration components thereof, but may be preferably made of nickel (Ni). The bather layer 115 is not willing to react with an etchant during a process of forming the metal post 140 by etching the second metal layer 117, thereby protecting the first metal layer 113 from the etchant.

Figure 8:
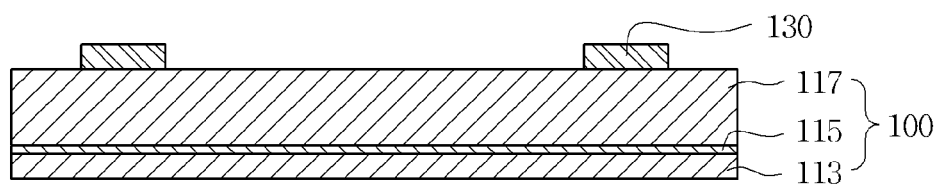
Figure 9:
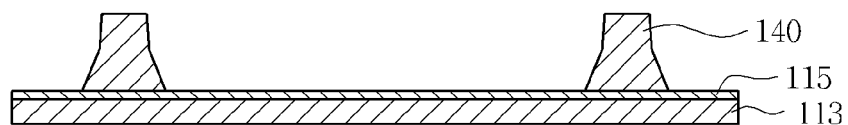

Then, as shown in FIGS. 8 and 9, the second metal layer 117 is selectively etched, thereby forming the metal post 140. A process of forming the metal post 140 will be described in detail.

An etching resist 130 is applied to the surface of the second metal layer 117 formed at the outer side of the metal member 100 and then is patterned, thereby forming an etching resist pattern (see FIG. 8). Thereafter, the second metal layer 117 is selectively etched before the bather layer 115 by applying a tenting method to form the metal post 140 having a pillar shape, and the etching resist pattern is removed (see FIG. 9). Herein, the diameter and the shape of the metal post 140 may be variously formed according to the thickness of the second metal layer 117 and the set condition of the etchant. However, the metal post 140 generally has a shape in which its diameter is increased in a direction towards the barrier layer 115.

Figure 10:
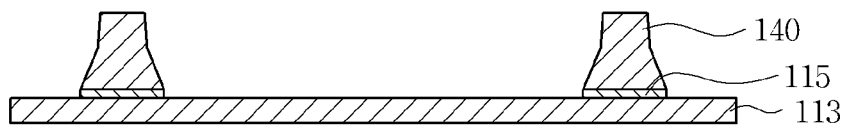

Then, as shown in FIG. 10, the exposed bather layer 115 formed by etching the second metal layer 117 is etched to be removed from the metal post 140. When the bather layer 115 is made of nickel, the bather layer 115 is removed using a nickel etchant. In this case, the nickel etchant is not reactive with copper, such that the metal post 140 and the first metal layer 113 are not etched.

Figure 11:
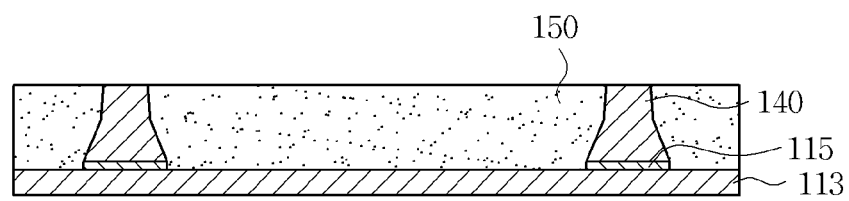

Then, as shown in FIG. 11, an insulating layer 150 is stacked on the first metal layer 113 through which the metal post 140 is penetrated. Herein, the insulating layer 150 may, for example, include a polymer resin such as prepreg (PPG) or an epoxy-based resin such as FR-4, BT, or the like. Thereafter, a desmear process is performed so as to remove resin residues on the penetrated metal post 140.

Figure 12:
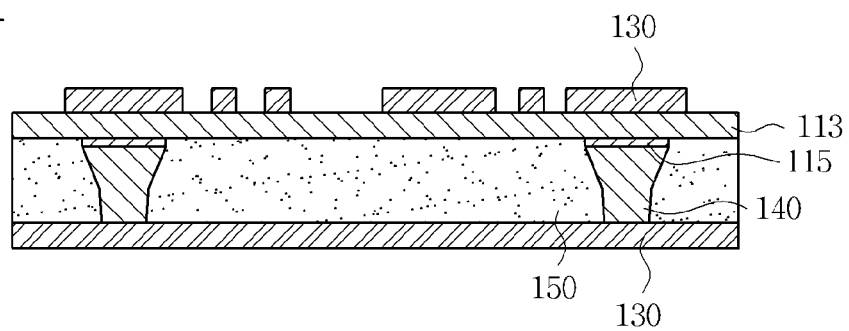
Figure 13:
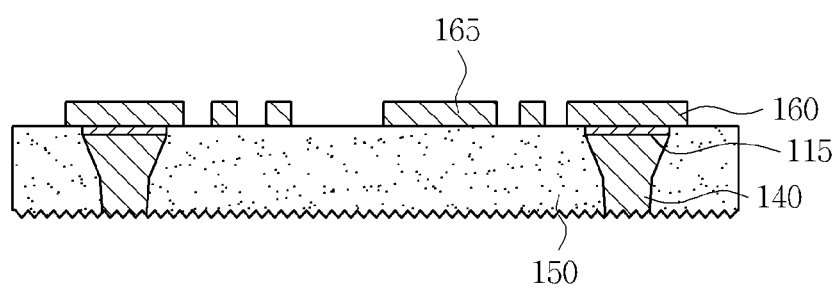

Then, as shown in FIGS. 12 and 13, the first metal layer 113 in contact with one surface of the insulating layer 150 is patterned to form a circuit layer 160, and an exposed surface of the insulating layer 150 is polished to form a roughness.

First, the etching resist 130 is applied to the surface of the first metal layer 113 and then is patterned, thereby forming an etching resist pattern (see FIG. 12).

Thereafter, the first metal layer 113 is selectively etched by applying a tenting method to form the circuit layer 160, and the etching resist pattern is removed (see FIG. 13).

Then, in order to enhance adhesion between the insulating layer 150 and the solder resist 170 (see FIG. 14), the exposed surface of the insulating layer 150 is polished to form a roughness, thereby generating anchor effects (see FIG. 13). The method of forming a roughness may use one or two or more methods of a group consisting of etching, CZ pretreatment, black oxide, brown oxide, acid base chemical (ABC), ceramic buff, and Z-scrubbing treatment; however, well-known methods by those skilled in the art may not be particularly limited thereto but be applied.

Figure 14:
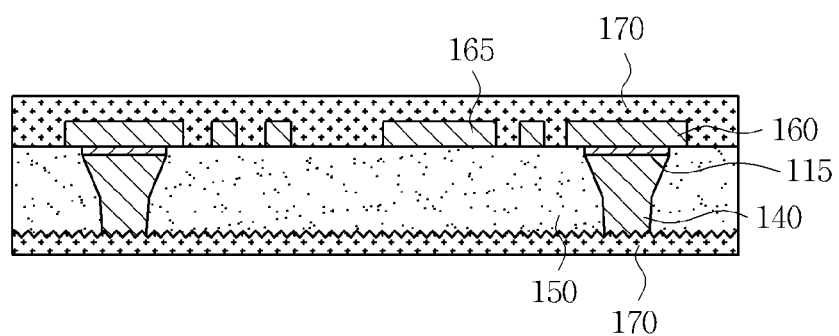

Then, as shown in FIG. 14, a solder resist 170 is applied to both surfaces of the insulating layer 150.

Figure 15:
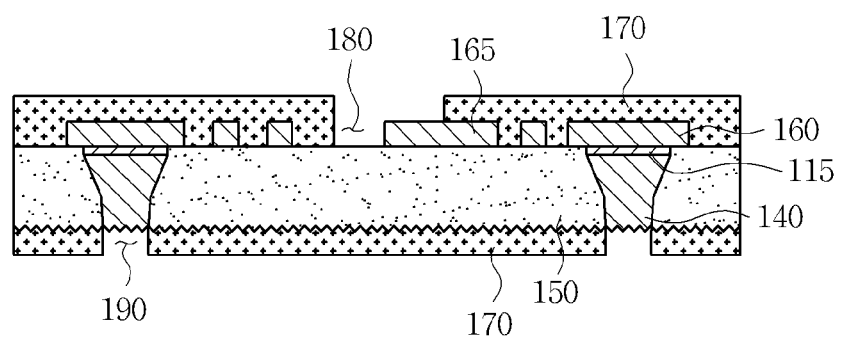

Then, as shown in FIG. 15, a first opening 180 is formed in the solder resist 170 so that a pad part 165 of the circuit layer 160 formed on one surface of the insulating layer 150 is exposed, and a second opening 190 is formed in the solder resist 170 so that the metal post 140 formed on the other surface of the insulating layer 150 is exposed.

Figure 16:
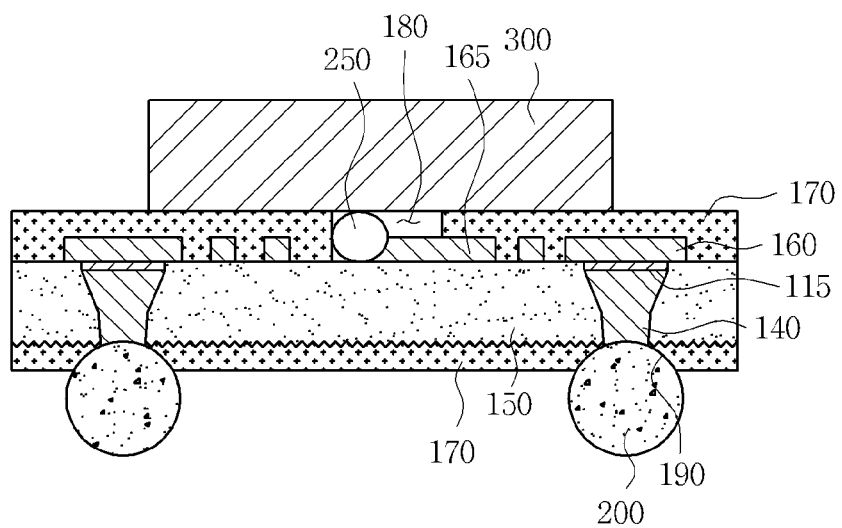

Then, as shown in FIG. 16, a solder bump 250 is formed on the pad part 165 exposed by the first opening 180 and then, a semiconductor chip 300 is mounted on the solder resist 170. The semiconductor chip 300 is electrically connected to the pad part 165 of the circuit layer 160 through the solder bump 250. In addition, a solder ball 200 is formed on the metal post 140 exposed by the second opening 190.

FIGS. 17 to 27 are cross-sectional views showing a method for manufacturing a semiconductor package according to a second preferred embodiment of the present invention in a process sequence. Hereinafter, a method for manufacturing a semiconductor package according to the present embodiment will be described with reference to the accompanying drawings.

Figure 17:
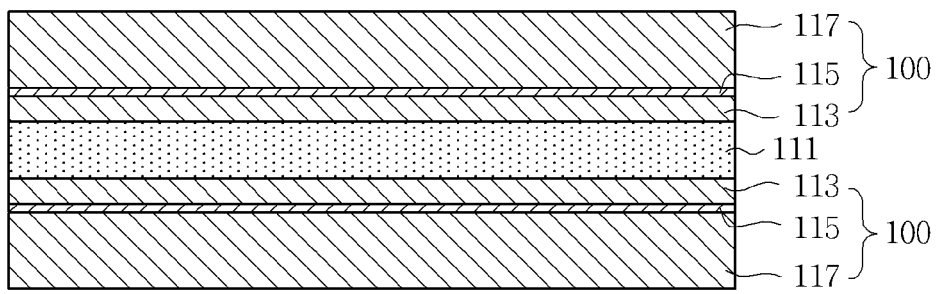
FIGS. 17 to 27 are cross-sectional views showing a method for manufacturing a semiconductor package according to a second preferred embodiment of the present invention in a process sequence.

First, as shown in FIG. 17, a base member 120 is provided, the base member 120 in which a first metal layer 113, a barrier layer 115, and a second metal layer 117 are each stacked on both surfaces of a adhesive member 111 in sequence based on the adhesive member 111.

The base member 120 may be provided by laminating a first metal layer 113, a bather layer 115, and a second metal layer 117 on both surfaces of an adhesive member 111 in sequence based on the adhesive member 111. Furthermore, the base member 120 may be provided by preparing a pair of three-layer metal members 100 configured of a first metal layer 113, a bather layer 115, and a second metal layer 117, disposing the pair of metal members 100 so that their first metal layers 113 face each other, and then bonding the pair of metal members 110 to both surfaces of the adhesive member 111.

The adhesive member 111 serves to temporarily bond the pair of metal members 100 and is separated from the metal members 100, after the manufacturing the metal post 140, the removing the bather layer 115, and the laminating the insulating layer 150 are performed. If this material is well-known by those skilled in the art, it may be selectively applied, without being particularly limited.

Herein, the first metal layer 113 and the second metal layer 117 are made of copper (Cu). In the same manner as in the first embodiment, the first metal layer 113 is patterned to be formed as a circuit layer 160 and the second metal layer 117 is selectively etched to be formed as a metal post 140. In addition, the second metal layer 117 may be selected to have a thickness in the range of 50 to 300 μm, and the first metal layer 113 may have a thickness thinner than that of the second metal layer 117.

In addition, the bather layer 115 is interposed between the first metal layer 113 and the second metal layer 117 and has no limit in configuring the components thereof, but may be preferably made of nickel (Ni). The bather layer 115 is not willing to react with an etchant during a process of forming the metal post 140 by etching the second metal layer 117, thereby protecting the first metal layer 113 from the etchant.

Figure 18:
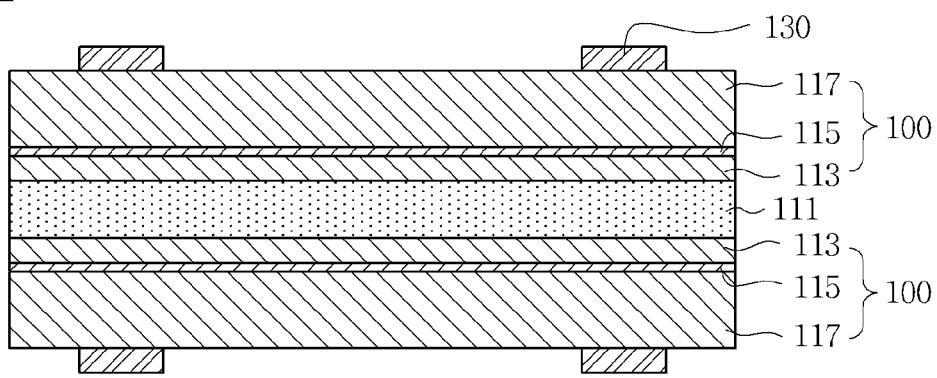
Figure 19:
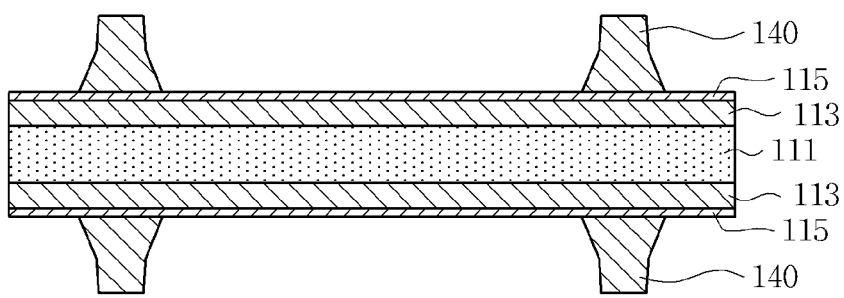

Then, as shown in FIGS. 18 and 19, the second metal layer 117 is selectively etched, thereby forming the metal post 140. In this case, the metal post 140 may have a shape in which its diameter is increase in a direction towards the bather layer 115. The process of forming the metal post 140 is the same as that of forming the metal post 140 in the first preferred embodiment of the present invention and thus, a detailed description thereof will be omitted.

Figure 20:
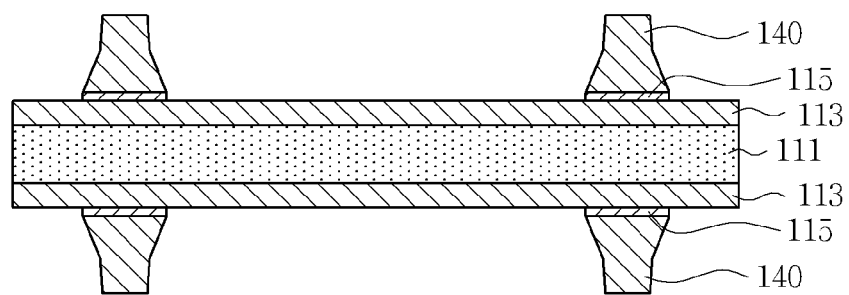

Then, as shown in FIG. 20, the exposed bather layer 115 formed by etching the second metal layer 117 is etched to be removed from the metal post 140. When the bather layer 115 is made of nickel, the bather layer 115 is removed using a nickel etchant. In this case, the nickel etchant is not reactive with copper, such that the metal post 140 and the first metal layer 113 are not etched.

Figure 21:
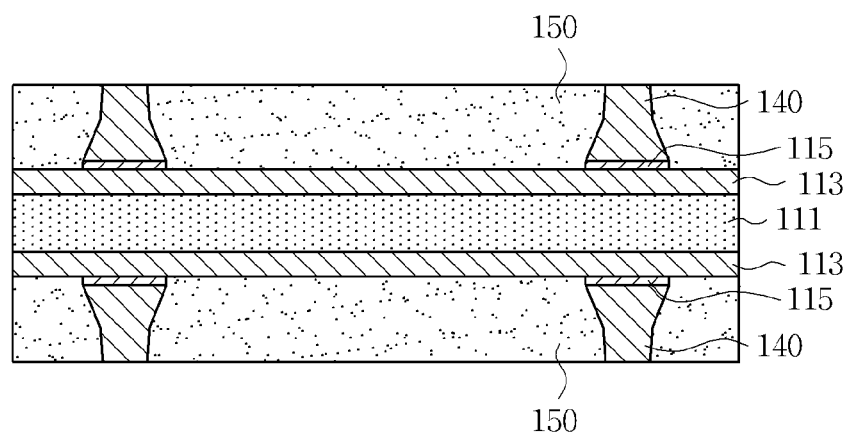

Then, as shown in FIG. 21, an insulating layer 150 is stacked on the first metal layer 113 through which the metal post 140 is penetrated. Herein, the insulating layer 150 may, for example, include a polymer resin such as prepreg (PPG) or an epoxy-based resin such as FR-4, BT, or the like. Thereafter, a desmear process is performed so as to remove resin residues on the penetrated metal post 140.

Figure 22:
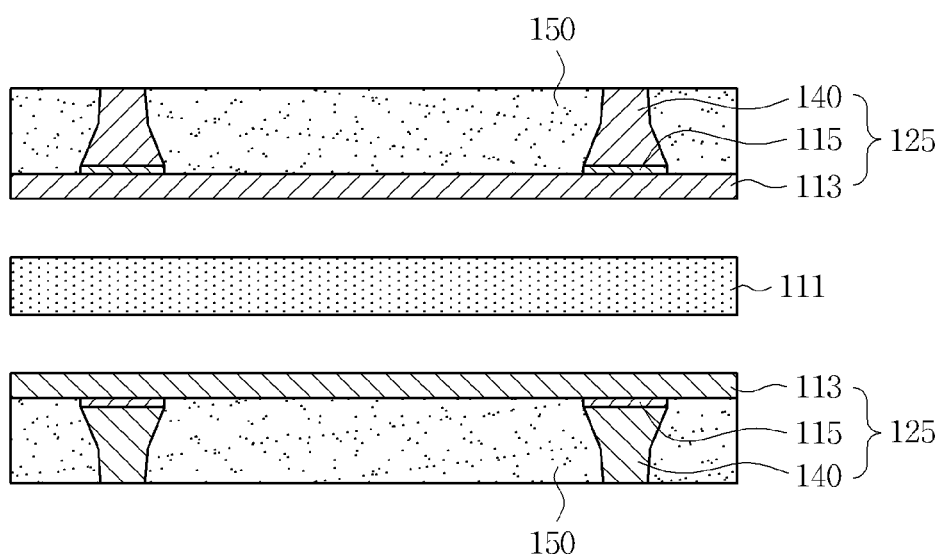

Then, as shown in FIG. 22, the first metal layer 113 is separated from the adhesive member 11, thereby accomplishing a pair of structures 125. In other words, after the first metal layer 113 is separated from the adhesive member 111, the pair of structures 125 are simultaneously formed, the structures 125 configured of the first metal layer 113, the bather layer 115, the metal post 140, and the insulating layer 150, thereby making it possible to reduce manufacturing costs.

Figure 23:
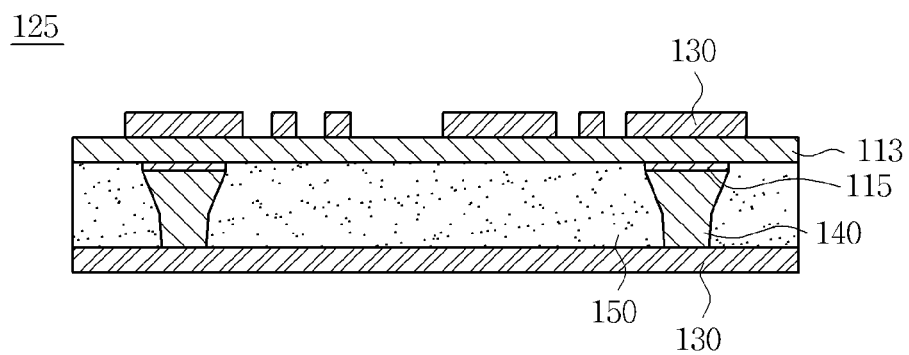
Figure 24:
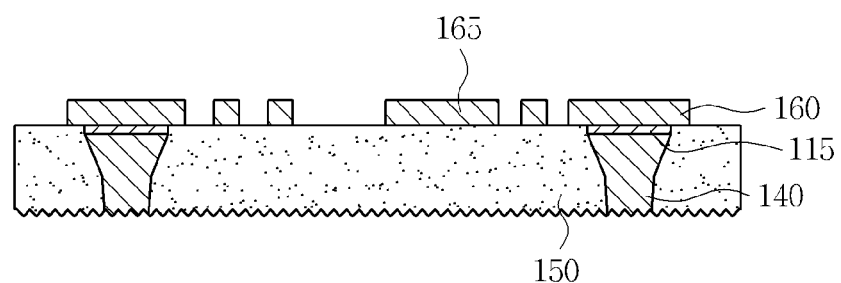

Then, as shown in FIGS. 23 and 24, the first metal layer 113 formed on one surface of each of the structures 125 is patterned to form a circuit layer 160, and an exposed surface of the insulating layer 150 is polished to form a roughness.

First, the process of forming the circuit layer 160 is the same as that of forming the circuit layer 160 in the first preferred embodiment of the present invention and thus, a detailed description thereof will be omitted (see FIG. 23).

Then, in order to enhance adhesion between the insulating layer 150 and the solder resist 170 (see FIG. 25), the exposed surface of the insulating layer 150 is polished to form a roughness, thereby generating anchor effects (see FIG. 24). The process of forming the roughness is the same as that of forming the roughness in the first preferred embodiment of the present invention and thus, a detailed description thereof will be omitted.

Figure 25:
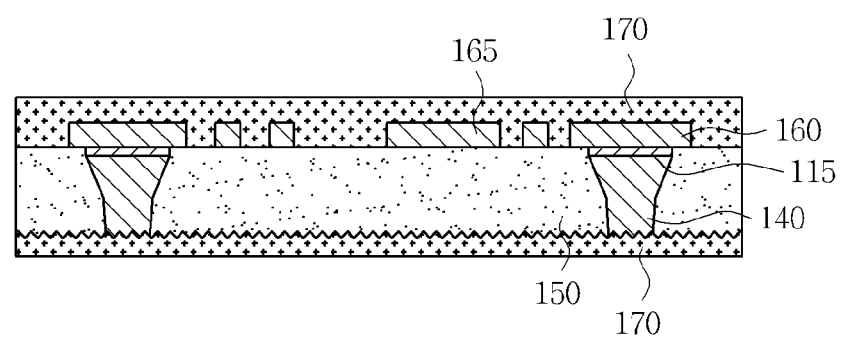

Then, as shown in FIG. 25, the solder resist 170 is applied to both surfaces of the insulating layer 150.

Figure 26:
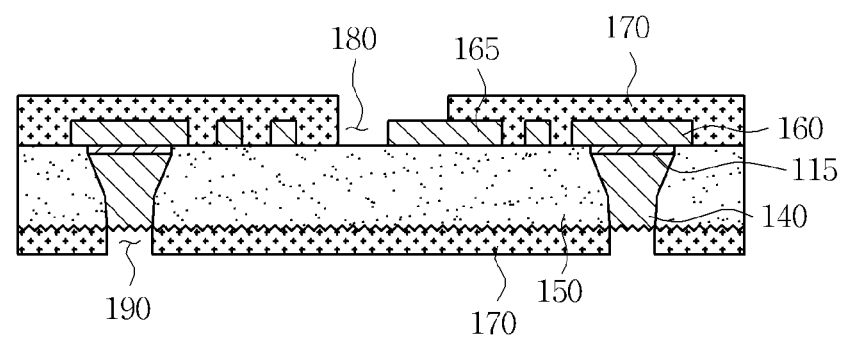

Then, as shown in FIG. 26, a first opening 180 is formed in the solder resist 170 so that a pad part 165 of the circuit layer 160 formed on one surface of the insulating layer 150 is exposed, and a second opening 190 is formed in the solder resist 170 so that the metal post 140 formed on the other surface of the insulating layer 150 is exposed.

Figure 27:
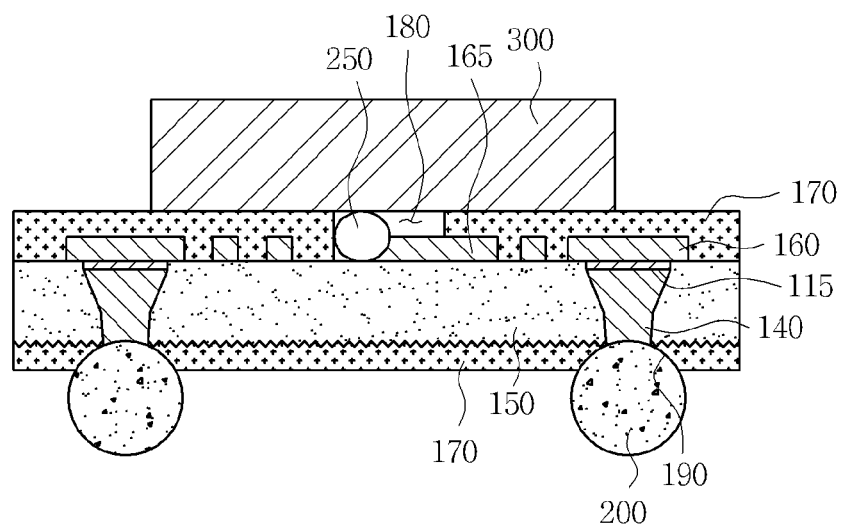

Then, as shown in FIG. 27, a solder bump 250 is formed on the pad part 165 exposed by the first opening 180 and then, a semiconductor chip 300 is mounted on the solder resist 170. The semiconductor chip 300 is electrically connected to the pad part 165 of the circuit layer 160 through the solder bump 250. In addition, a solder ball 200 is formed on the metal post 140 exposed by the second opening 190.

According to the method for manufacturing a semiconductor package according to the present invention, the semiconductor chip is electrically connected to the printed circuit board using a solder bump rather than a wire bonding, thereby making it possible to implement a high density package.

According to the present invention, the metal post is formed instead of the through hole required in the interlayer circuit connection, thereby making it possible to reduce costs required during the processing/plating of the through hole.

In addition, the present invention uses the base member in which the first metal layer, the bather layer, and the second metal layer are stacked on both surfaces thereof in sequence based on the adhesive member. Therefore, if the first metal layer is separated from the adhesive member after processing a series of manufacturing processes, two printed circuit boards are simultaneously formed, thereby making it possible to improve manufacturing efficiency.

Although the preferred embodiments of the present invention have been disclosed for illustrative purposes, they are for specifically explaining the present invention and thus a method for manufacturing a semiconductor package according to the present invention is not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A method for manufacturing a semiconductor package, comprising:
   (A) preparing a metal member in which a first metal layer, a barrier layer, and a second metal layer are stacked in sequence;
   (B) forming a metal post by selectively etching the second metal layer;
   (C) removing the exposed barrier layer from the metal post and laminating an insulating layer on the first metal layer through which the metal post is penetrated; and
   (D) patterning the first metal layer contacting one surface of the insulating layer to form a circuit layer: and,
   (E) after applying a solder resist to both surfaces of the insulating layer, forming a first opening by processing the solder resist so that a pad part of the circuit layer formed on one surface of the insulating layer is exposed and forming a second opening by processing the solder resist so that the metal post formed on the other surface of the insulating layer is exposed.

2. The method for manufacturing a semiconductor package as set forth in claim 1, wherein the first metal layer and the second metal layer are made of copper, and the barrier layer is made of nickel.

3. The method for manufacturing a semiconductor package as set forth in claim 1, wherein the second metal layer has a thickness in the range of 50 to 300 μm.

4. The method for manufacturing a semiconductor package as set forth in claim 1, wherein step (B) includes:
   (B1) applying an etching resist to a surface of the second metal layer; and
   (B2) after patterning the etching resist, selectively etching the second metal layer before the barrier layer to form the metal post.

5. The method for manufacturing a semiconductor package as set forth in claim 1, wherein the metal post at step (B) has a diameter increased in a direction towards the barrier layer.

6. The method for manufacturing a semiconductor package as set forth in claim 1, further comprising, after step (C), (C') treating an exposed surface of the insulating layer to form a roughness.

7. The method for manufacturing a semiconductor package as set forth in claim 1, step (D) includes:
   (D1) applying an etching resist to a surface of the first metal layer; and
   (D2) after patterning the etching resist, selectively etching the first metal layer to form a circuit layer.

8. The method for manufacturing a semiconductor package as set forth in claim 1, further comprising, after step (E), (F) mounting a semiconductor chip on the pad part exposed by the first opening through a solder bump and forming a solder ball on the metal post exposed by the second opening.

9. A method for manufacturing a semiconductor package, comprising:
   (A) preparing a base member in which a first metal layer, a barrier layer, and a second metal layer are stacked on both surfaces thereof in sequence based on an adhesive member;
   (B) forming a metal post by selectively etching the second metal layer;
   (C) removing the exposed barrier layer from the metal post, laminating an insulating layer on the first metal layer through which the metal post is penetrated, and then, separating the first metal layer from the adhesive member; and
   (D) patterning the first metal layer contacting one surface of the insulating layer to form a circuit layer.

10. The method for manufacturing a semiconductor package as set forth in claim 9, wherein the first metal layer and the second metal layer are made of copper, and the barrier layer is made of nickel.

11. The method for manufacturing a semiconductor package as set forth in claim 9, wherein the second metal layer has a thickness in the range of 50 to 300 μm.

12. The method for manufacturing a semiconductor package as set forth in claim 9, wherein step (B) includes:
   (B1) applying an etching resist to a surface of the second metal layer; and
   (B2) after patterning the etching resist, selectively etching the second metal layer before the barrier layer to form the metal post.

13. The method for manufacturing a semiconductor package as set forth in claim 9, wherein the metal post at step (B) has a diameter increased in a direction towards the barrier layer.

14. The method for manufacturing a semiconductor package as set forth in claim 9, further comprising, after step (C), (C') treating an exposed surface of the insulating layer to form a roughness.

15. The method for manufacturing a semiconductor package as set forth in claim 9, step (D) includes:
   (D1) applying an etching resist to a surface of the first metal layer; and
   (D2) after patterning the etching resist, selectively etching the first metal layer to form a circuit layer.

16. The method for manufacturing a semiconductor package as set forth in claim 9, further comprising, after step (D), (E) after applying a solder resist to both surfaces of the insulating layer, forming a first opening by processing the solder resist so that a pad part of the circuit layer formed on one surface of the insulating layer is exposed and forming a second opening by processing the solder resist so that the metal post formed on the other surface of the insulating layer is exposed.

17. The method for manufacturing a semiconductor package as set forth in claim 16, further comprising, after step (E), (F) mounting a semiconductor chip on the pad part exposed by the first opening through a solder bump and forming a solder ball on the metal post exposed by the second opening.

\* \* \* \* \*